(12) United States Patent
Chang et al.

(10) Patent No.: US 11,630,483 B2
(45) Date of Patent: Apr. 18, 2023

(54) DISPLAY APPARATUS

(71) Applicant: LG ELECTRONICS INC., Seoul (KR)

(72) Inventors: Chunsoo Chang, Seoul (KR); Kangyeung Lee, Seoul (KR); Kukyoul Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 287 days.

(21) Appl. No.: 17/026,033

(22) Filed: Sep. 18, 2020

(65) Prior Publication Data

US 2021/0382522 A1 Dec. 9, 2021

(51) Int. Cl.
*G06F 1/16* (2006.01)
*F16M 11/12* (2006.01)
(Continued)

(52) U.S. Cl.
CPC ......... *G06F 1/1607* (2013.01); *F16M 11/125* (2013.01); *F16F 15/067* (2013.01);
(Continued)

(58) Field of Classification Search
CPC ...... F16M 11/18; F16M 11/22; F16M 11/105; F16M 11/125; F16M 11/2021;
(Continued)

(56) References Cited

U.S. PATENT DOCUMENTS 5,494,447 A * 2/1996 Zaidan .................... G06F 1/162
439/31
5,941,493 A * 8/1999 Cheng .................. F16M 11/105
248/371

(Continued)

FOREIGN PATENT DOCUMENTS

CN 109424835 B * 9/2021 ........... F16M 11/046
JP 08-063259 3/1996
(Continued)

OTHER PUBLICATIONS

European Patent Office Application Serial No. 20195653.9, Search Report dated Feb. 2, 2018, 6 pages.
(Continued)

*Primary Examiner* — Tan Le
(74) *Attorney, Agent, or Firm* — Lee, Hong, Degerman, Kang & Waimey PC (57) ABSTRACT

A display apparatus includes a base, a stand, a head having a display and pivotable between a landscape mode and a portrait mode, a penetration groove, an inner bracket disposed inside the head and having a slit formed therein to face the penetration groove, a shaft including a first extension connected to the stand and extending to an inside of the head through the penetration groove and a second extension extending from an end of the first extension to pass through the slit, a long hole formed in the second extension and extending in a longitudinal direction of the second extension, a guide pin fixed to an inside of the head to pass through the long hole, a slider sliding along the second extension, and a spring disposed on an outer circumference of the second extension and configured to pressurize the slider to maintain contact between the slider and the inner bracket.

18 Claims, 10 Drawing Sheets

(51) Int. Cl.
*H05K 5/02* (2006.01)
*H04N 5/64* (2006.01)
*F16F 15/067* (2006.01)
*H05K 5/03* (2006.01)

(52) U.S. Cl.
CPC ........ *F16F 2230/0076* (2013.01); *H04N 5/64* (2013.01); *H05K 5/02* (2013.01); *H05K 5/03* (2013.01)

(58) Field of Classification Search
CPC ........... F16M 11/2064; F16M 2200/08; F16M 2200/068; F16F 2230/0076; F16F 15/067; F16F 15/046; H04N 5/64; H04N 5/655; G06F 1/1607; G06F 1/1601; H05K 5/0017; H05K 5/03; H05K 5/024
See application file for complete search history.

(56) References Cited

U.S. PATENT DOCUMENTS

| | | | | |
|---|---|---|---|---|
| 6,504,707 | B2 * | 1/2003 | Agata | .................. G06F 1/1683 248/920 |
| 7,815,154 | B2 | 10/2010 | Oh et al. | |
| 2006/0007644 | A1 | 1/2006 | Huilgol et al. | |
| 2007/0262210 | A1 | 11/2007 | Oh et al. | |
| 2008/0062099 | A1 * | 3/2008 | Oshima | ................ F16M 11/105 345/87 |
| 2012/0008270 | A1 | 1/2012 | Tsuchihashi et al. | |
| 2015/0346770 | A1 | 12/2015 | Onda | |

FOREIGN PATENT DOCUMENTS

| | | | |
|---|---|---|---|
| JP | 2000-020166 | | 1/2000 |
| JP | 2000047591 | | 2/2000 |
| JP | 2010-271356 | | 12/2010 |
| JP | 2015-225600 | | 12/2015 |
| KR | 20050093377 | A * | 9/2005 |
| KR | 20070109009 | | 11/2007 |
| KR | 100963145 | B1 * | 6/2010 |
| KR | 102308450 | B1 * | 10/2021 |

OTHER PUBLICATIONS

Korean Intellectual Property Office Application No. 10-2020-0069227, Notice of Allowance dated Aug. 9, 2022, 3 pages.

* cited by examiner

DISPLAY APPARATUS

CROSS-REFERENCE TO RELATED APPLICATIONS

Pursuant to 35 U.S.C. § 119(a), this application claims the benefit of earlier filing date and right of priority to Korean Patent Application No. 10-2020-0069227, filed on Jun. 8, 2020, the contents of which are all hereby incorporated by reference herein in its entirety.

BACKGROUND

The present disclosure relates to a display apparatus.

A display apparatus displays image information received from the outside or image information stored therein. Representative examples of the display apparatus include a television, a monitor, a laptop, a smartphone, etc.

However, conventional mobile display apparatuses such as smartphones have limited sizes for portability. On the contrary, relatively large display apparatuses such as TVs require a wide installation space and have inconvenient mobility.

RELATED ART

Patent Document

KR 10-2007-0109009A (published on Nov. 15, 2007)

SUMMARY

The present disclosure is devised to solve the above-described problems and an object of the present disclosure is to provide a display apparatus in which a head is pivotable between a landscape mode and a portrait mode by applying a simple structure.

Another object of the present disclosure is to provide a compact display apparatus having a beautiful design.

A display apparatus according to an embodiment of the present disclosure includes a base, a stand vertically extending upward from the base, a head having a display provided on a front surface thereof and pivotable between a landscape mode in which a long side of a circumference is in a horizontal state and a portrait mode in which the long side is in a vertical state, a penetration groove extending along the circumference of the head, an inner bracket disposed inside the head and having a slit formed therein to face the penetration groove, a shaft including a first extension connected to the stand and extending to an inside of the head through the penetration groove and a second extension extending from an end of the first extension to pass through the slit, a long hole formed in the second extension and extending in a longitudinal direction of the second extension, a guide pin fixed to an inside of the head to pass through the long hole, a slider sliding along the second extension, and a spring disposed on an outer circumference of the second extension and configured to pressurize the slider to maintain contact between the slider and the inner bracket.

A distance between the slit and the penetration groove may vary in a longitudinal direction of the penetration groove.

A distance between the slit and the guide pin in a longitudinal direction of the shaft may be smaller in the portrait mode than in the landscape mode of the head.

The penetration groove may include a first groove extending along a short side of the circumference of the head, and a second groove extending along the long side of the circumference of the head and connected with the first groove. The slit may include a first slit facing the first groove, and a second slit connected to the first slit and facing the second groove.

A distance between the slit and the guide pin in a longitudinal direction of the shaft may be maximized when the shaft passes through between the first groove and the second groove.

The guide pin may protrude from the inner bracket.

The shaft may be horizontally maintained at the time of pivot of the head.

A length of the second extension may be greater than that of the first extension.

A support portion supporting one end of the spring may be provided on an outer circumference of the second extension, and the spring may be compressed between the support portion and the slider.

The support portion may be located between the long hole and the spring in a longitudinal direction of the second extension.

The display apparatus may further include an electric wire extending from an inside of the base to an inside of the head through an inside of the stand, and a passage for guiding the electric wire to the inside of the head may be formed in the first extension.

The inner bracket may include a first surface parallel with the display, a second surface stepped with respect to the first surface, and a guide surface connecting the first surface and the second surface, having the slit formed therein, and contacting the slider.

The slider may include a curved surface which is in point-contact or line-contact with the inner bracket.

An expansion expanding outward in a radial direction and located between the stand and the circumference of the head may be formed at the first extension.

A pair of connection holes may be formed in the stand, and the first extension may be rotatably connected to the stand by passing through the pair of connection holes.

The display apparatus may further include a nut fastened to an end of the first extension, and the nut may be located at an opposite side of the circumference of the head with respect to the stand.

The display apparatus may further include a friction washer provided on an outer circumference of the first extension and located between the nut and the stand.

A display apparatus according to an embodiment of the present disclosure includes a base, a stand vertically extending upward from the base, a head having a display provided on a front surface thereof and pivotable between a landscape mode in which a long side of a circumference is in a horizontal state and a portrait mode in which the long side is in a vertical state, a penetration groove extending along the circumference of the head, a shaft horizontally passing through the stand and horizontally extending to an inside of the head through the penetration groove, a nut fastened to an end of the shaft and located at an opposite side of the circumference of the head with respect to the stand, and a first friction washer provided on an outer circumference of the shaft and located between the nut and the stand.

The display apparatus may further include a second friction washer provided on the outer circumference of the shaft and located between the circumference of the head and the stand.

DETAILED DESCRIPTION OF THE EMBODIMENTS

Hereinafter, specific embodiments of the present disclosure will be described in detail with reference to the drawings.

In the following, when one element is described as being "fastened" or "connected", this may mean that two elements are directly fastened or connected or mean a third element is interposed between two elements and the two elements are connected or fastened by the third element. In contrast, one element being "directly fastened" or "directly connected" to another element may mean that a third element is not interposed between the two elements.

Figure 1:
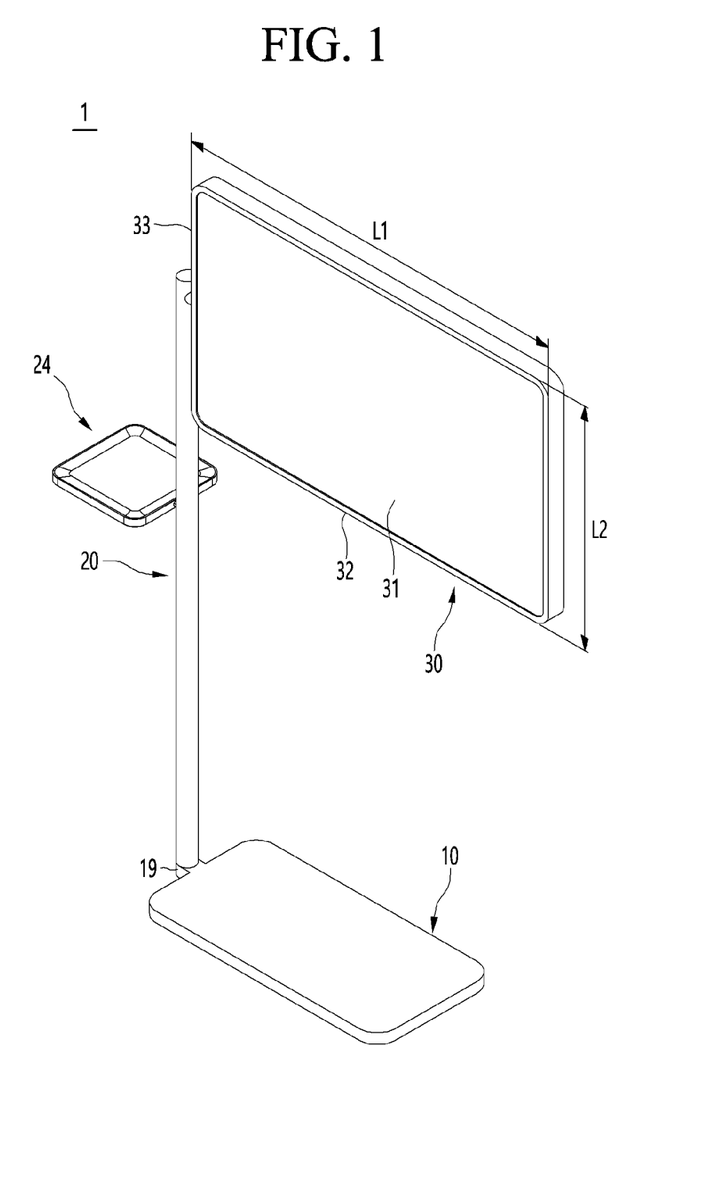
FIG. 1 is a perspective view of a display apparatus according to an embodiment of the present disclosure.
Figure 2:
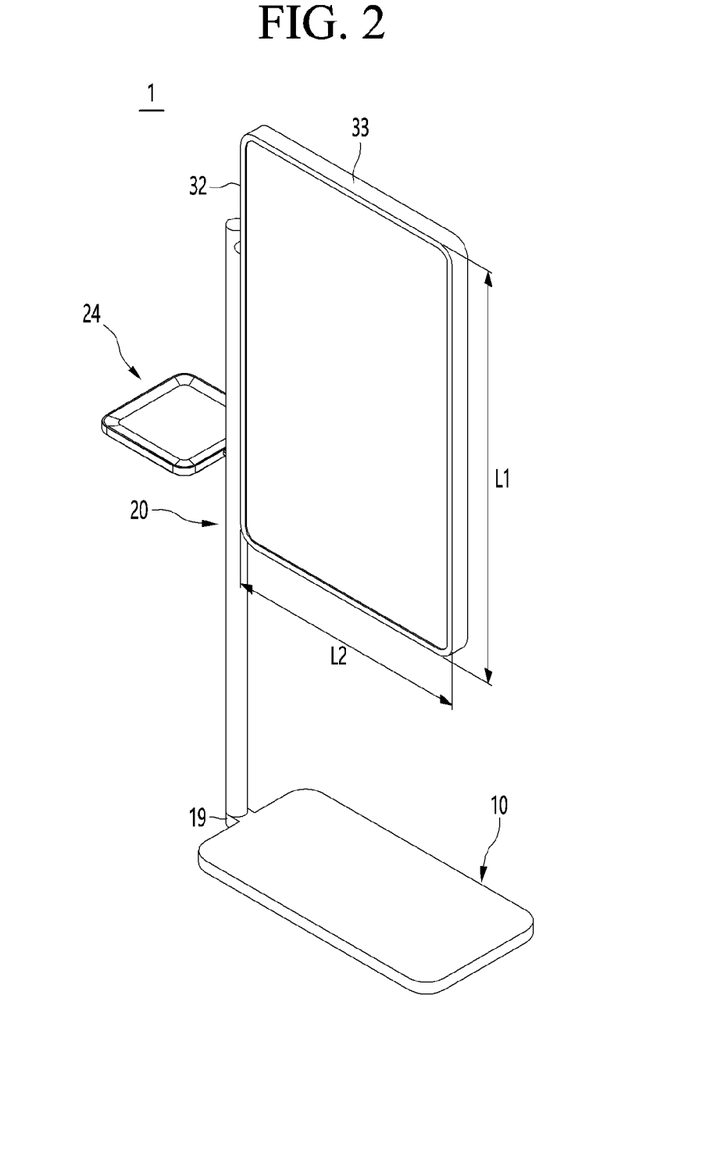
FIG. 2 is a perspective view showing a state in which a header shown in FIG. 1 is pivoted in a portrait mode.
Figure 3:
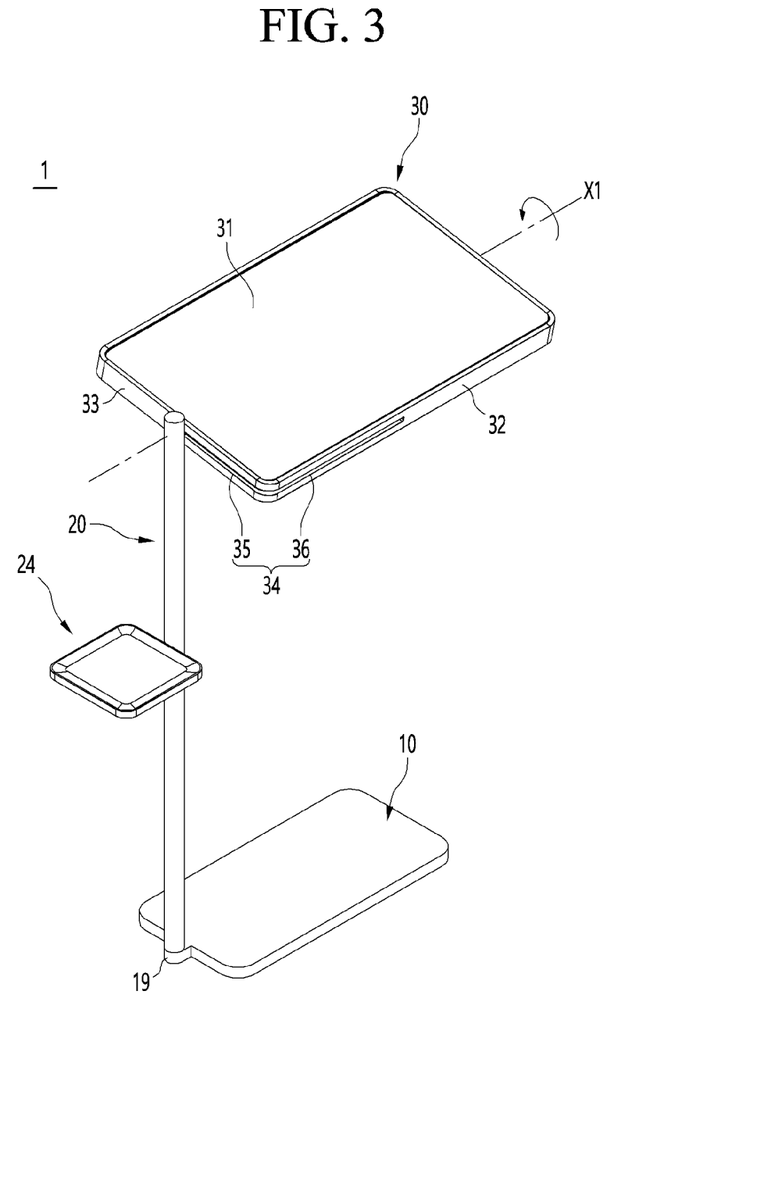
FIG. 3 is a view showing a state in which a head according to an embodiment of the present disclosure is tilted.
Figure 4:
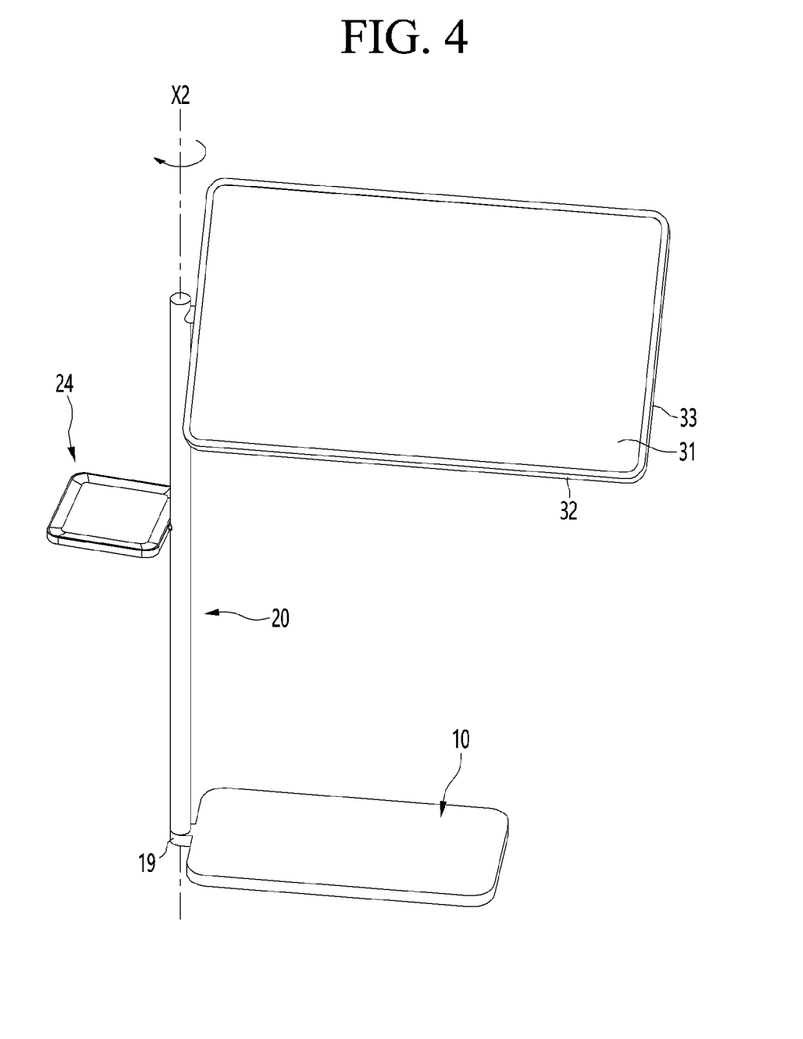
FIG. 4 is a view showing a state in which a head according to an embodiment of the present disclosure is swiveled.

FIG. 1 is a perspective view of a display apparatus according to an embodiment of the present disclosure, FIG. 2 is a perspective view showing a state in which a header shown in FIG. 1 is pivoted in a portrait mode, FIG. 3 is a view showing a state in which a head according to an embodiment of the present disclosure is tilted, and FIG. 4 is a view showing a state in which a head according to an embodiment of the present disclosure is swiveled.

The display apparatus 1 according to the embodiment of the present disclosure may include a base 10, a stand 20 and a head 30.

The base 10 may support the display apparatus 1 against a floor.

The stand 20 may vertically extend upward from the base 10. The stand 20 may connect the base 10 with the head 30. The stand 20 may have, but is not limited to, a vertical bar shape.

More specifically, the lower end of the stand 20 may be connected to the circumference of the base 10. A stand connector 19 protruding outward may be formed on the circumference of the base 10, and the lower end of the stand 20 may be connected to the stand connector 19.

The head 30 may be spaced apart upward from the base 10. A display 31 may be provided on the front surface of the head 30. An image or video may be displayed on the display 31. In addition, the display 31 may include a touchscreen.

Circumferences 32 and 33 of the head 30 may include a pair of long sides 32 and a pair of short sides 33. The longitudinal direction of the long side 32 and the longitudinal direction of the short side 33 may be perpendicular to each other. The length L1 of the long side 32 may be greater than the length L2 of the short side 33.

The head 30 may be pivoted between a landscape mode in which the long sides 32 are horizontal and the short sides 33 are vertical (see FIG. 1) and a portrait mode in which the long sides 32 are vertical and the short sides 33 are horizontal (see FIG. 2).

The head 30 may be located on the same side as the base 10 with respect to the stand 20. That is, the head 30 may overlap the base 10 in the vertical direction. Accordingly, since the center of gravity of the display apparatus 1 does not deviate from the upper side of the base 10, the display apparatus 1 may be stably supported without being overturned.

The left-and-right length of the base 10 may be less than the length L1 of the long side 32 of the head 30 and greater than the length L2 of the short side 33. Accordingly, in the landscape mode, the head 30 may laterally protrude from the base 10. The base 10 may laterally protrude from the head 30 in the portrait mode.

The stand 20 may extend to be sufficiently long. The height of the stand 20 may be greater than the length L1 of the long side 32 of the head 30. The height of the stand 20 may be greater than the sum L1+L2 of the length L1 of the long side 32 of the head 30 and the length L2 of the short side. The stand 20 may be connected to the circumferences 32 and 33 of the head 30. More specifically, the upper portion of the stand 20 may be connected to the circumferences 32 and 33 of the head 30.

Since the stand 20 is connected to the circumferences 32 and 33 rather than the rear surface of the head 30, the design of the appearance of the display apparatus 1 may be improved, and the rear surface of the head 30 may be used for another purpose. For example, a mirror and a backlight may be provided on the rear surface of the head 30.

The upper portion of the stand 20 may face the circumferences 32 and 33 of the head 30 in the horizontal direction. More specifically, in the landscape mode, the upper portion of the stand 20 may face the short sides 33 of the head 30 in the horizontal direction. In the portrait mode, the upper portion of the stand 20 may face the long sides 32 of the head 30 in the horizontal direction.

A penetration groove 34 may be formed in the circumferences 32 and 33 of the head 30. The penetration groove 34 may extend along the circumferences 32 and 33 of the head 30. The head 30 may be connected to the stand 20 through the penetration groove 34.

More specifically, a shaft 50 (see FIG. 6) protruding toward the penetration groove 34 may be formed on the stand 20. The shaft 50 may extend to the inside of the head 30 through the penetration groove 34.

The penetration groove 34 may include a first groove 35 formed in the short side 33 and a second groove 36 formed in the long side 32. The first groove 35 may extend along the short side 33 and the second groove 36 may extend along the long side 32. The first groove 35 may be connected to the second groove 36. The first groove 35 may be connected to the second groove 36 at a corner of the circumferences 32 and 33.

The first groove 35 may be formed in any one of the pair of short sides 33. The length of the first groove 35 may be less than that of the short side 33 and may be greater to or equal to half the length of the short side 33.

The second groove 36 may be formed in any one of the pair of long sides 32. The length of the second groove 36 may be less than that of the long side and may be greater to or equal to half the length of the long side 32.

Accordingly, at the time of pivot of the head 30, the shaft (see FIG. 6) may be maintained in a state of passing through the penetration groove 34. In the landscape mode, the shaft 50 may extend to the inside of the head 30 through the first groove 35. In the portrait mode, the shaft 50 may extend to the inside of the head 30 through the second groove 36.

The stand 20 may include a cradle 24. The cradle 24 may be horizontally disposed. A terminal such as a smartphone may be mounted on the cradle 24. The display apparatus 1 may be configured to perform charging of the terminal mounted on the cradle 24. In addition, the display apparatus 1 may be configured to selectively mirror the screen of the terminal mounted on the cradle 24 to the display 31 of the head 30.

The cradle 24 may be located at a lower height than the head 30. More specifically, a vertical distance from the base 10 to the cradle 24 may be less than a vertical distance from the base 10 to the head 30.

In addition, the head 30 and the cradle 24 may located at opposite sides of the stand 20. More specifically, the head 30 may be located on one side of the stand 20 and the cradle 24 may be located on the other side of the stand 20.

Meanwhile, as shown in FIG. 3, the head 30 may rotate about a horizontal axis x1 with respect to the stand 20. The horizontal axis x1 may correspond to the shaft 50 (see FIG. 6). The shaft 50 may be rotatably connected to the stand 20, and the head 30 may rotate along with the shaft 50. That is, the head 30 may be tilted by a predetermined angle with respect to the horizontal axis x1.

The head 30 may be tilted regardless of pivot of the head 30. That is, the head 30 may be tilted in the landscape mode and may be tilted in the portrait mode.

In addition, the head may rotate (tilt) by up to 180 degrees. That is, the head 30 may rotate such that the display 31 faces backward and the rear surface of the head 30 faces forward.

Accordingly, when the mirror and the backlight are provided on the rear surface of the head 30, a user may utilize the display apparatus as a standing mirror or a light.

In addition, as shown in FIG. 4, the head 30 may rotate about a vertical axis x2 with respect to the base 10 along with the stand 20. More specifically, the lower end of the stand 20 may be rotatably connected to the stand connector 19 of the base 10. Accordingly, the head 30 may be swiveled by a predetermined angle with respect to the vertical axis x2.

The swivel motion of the head 30 may be performed regardless of pivot and tilt of the head 30. That is, the head 30 may be swiveled in the landscape mode, may be swiveled in the portrait mode, and may be swiveled in a state of being tilted by a predetermined angle.

Figure 5:
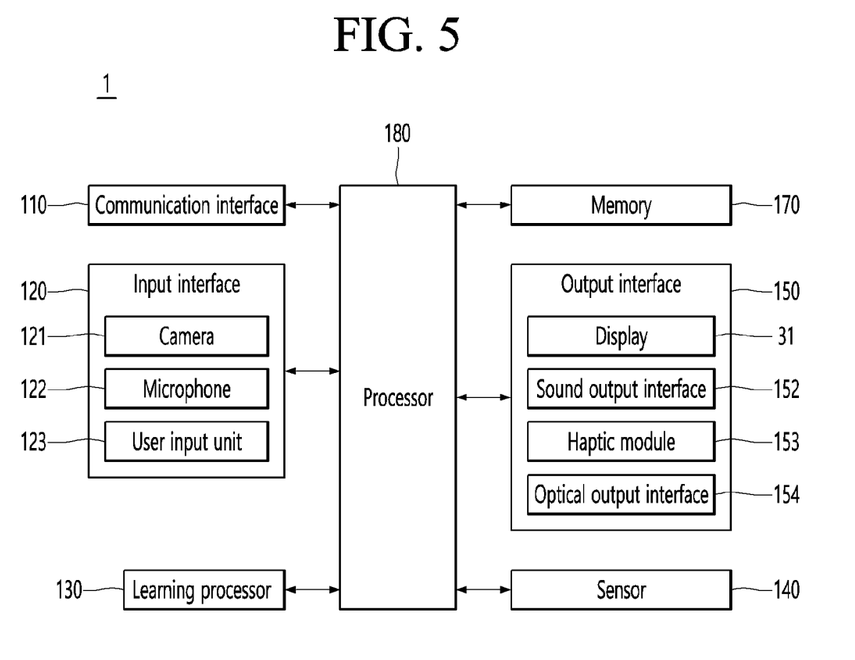
FIG. 5 is a block diagram illustrating components of a display apparatus according to an embodiment of the present disclosure.

FIG. 5 is a block diagram illustrating components of a display apparatus according to an embodiment of the present disclosure.

In particular, the components of FIG. 5 may be included in the head 30 of FIG. 1.

Referring to FIG. 5, the display apparatus 1 may include a communication interface 110, an input interface 120, a learning processor 130, a sensor 140, an output interface 150, a memory 170 and a processor 180.

The communication interface 110 may transmit and receive data to and from external devices such as another terminal or an external server using wired/wireless communication technology. For example, the communication interface 110 may transmit and receive sensor information, user input, learning models, control signals, etc. to and from the external devices.

At this time, communication technologies used by the communication interface 110 may include GSM (Global System for Mobile communication), CDMA (Code Division Multi Access), LTE (Long Term Evolution), 5G, WLAN (Wireless LAN), Wi-Fi (Wireless-Fidelity), Bluetooth™, RFID (Radio Frequency Identification), Infrared Data Association (IrDA), ZigBee, NFC (Near Field Communication), etc.

The input interface 120 may acquire various types of data.

At this time, the input interface 120 may include a camera for receiving an image signal, a microphone for receiving an audio signal, a user input interface for receiving information from a user, etc. Here, the camera or the microphone may be treated as a sensor, and signals acquired from the camera or the microphone may be referred to as sensing data or sensor information.

The input interface 120 may acquire input data to be used when output is acquired using learning data and learning models for model learning. The input interface 120 may acquire raw input data and, in this case, the processor 180 or the learning processor 130 may extract input features as preprocessing of input data.

The input interface 120 may include a camera 121 for receiving an image signal, a microphone 122 for receiving an audio signal, and a user input unit 123 for receiving information from a user.

The voice data or image data collected by the input interface 120 may be analyzed and processed as control commands of the user.

The input interface 120 serves to receive image information (or signals), audio information (or signals), data or user input information, and, for input of the image information, the display apparatus 1 may include one or a plurality of cameras 121.

The camera 121 processes an image frame such as a still image or a moving image obtained by an image sensor in a video call mode or a capture mode. The processed image frame may be displayed on a display 31 or a memory 170.

The microphone 122 processes an external acoustic signal into electrical audio data. The processed audio data may be variously used according to the function (or application program) executed in the display apparatus 1. Meanwhile, the microphone 122 may include various noise removal algorithms to remove noise generated in the process of receiving the external sound signal.

The user input interface 123 receives information from the user, and, when information is received through the user input interface 123, the processor 180 may control operation of the display apparatus 1 to correspond to the received information.

The user input unit 123 may include one or more of a mechanical input element (for example, a mechanical key, a button located on a front and/or rear surface or a side surface of the terminal 1, a dome switch, a jog wheel, a jog switch, and the like) or a touch input element. As one example, the touch input element may be a virtual key, a soft key or a visual key, which is displayed on a touchscreen through software processing, or a touch key located on a location other than the touchscreen.

The learning processor 130 may train a model composed of an artificial neural network using learning data. Here, the trained artificial neural network may be referred to as a learning model. The learning model may be used to infer a result value with respect to new input data rather than learning data, and the inferred value may be used as a basis for determining certain operation.

At this time, the learning processor 130 may include a memory integrated with or implemented in the display apparatus 1. Alternatively, the learning processor 130 may be implemented using the memory 170, an external memory directly coupled to the display apparatus 1 or a memory maintained in an external device.

The sensor 140 may acquire at least one of internal information of the display apparatus 1, surrounding environment information of the display apparatus 1 or user information using various sensors.

At this time, the sensor included in the sensor 140 may include a proximity sensor, an illumination sensor, an acceleration sensor, a magnetic sensor, a gyroscope sensor, an inertia sensor, an RGB sensor, a finger scan sensor, an ultrasonic sensor, an optical sensor, a microphone, a Lidar, a radar, etc.

The output interface 150 may generate video, audio or tactile output.

At this time, the output interface 150 may include a display for outputting video information, a speaker for outputting audio information, and a haptic module for outputting tactile information, etc.

The output interface 150 may include at least one of a display 31, a sound output unit 152, a haptic module 153 or an optical output unit 154.

The display 31 displays (outputs) information processed in the display apparatus 1. For example, the display 31 may display execution screen information of an application program executed by the display apparatus 1 or user interface (UI) and graphical user interface (GUI) information according to the executed screen information.

The display 31 may have an inter-layered structure or an integrated structure with a touch sensor in order to realize a touchscreen. The touchscreen may function as the user input unit 123 which provides an input interface between the display apparatus 1 and the user and provide an output interface between the terminal 1 and a user.

The sound output interface 152 may output audio data received from the communication interface 110 or stored in the memory 170 in a call signal reception mode, a call mode, a record mode, a speech recognition mode, a broadcast reception mode, and the like.

The sound output interface 152 may also include a receiver, a speaker, a buzzer, or the like.

The haptic module 153 generates various tactile effects that a user feels. A typical example of a tactile effect generated by the haptic module 153 is vibration.

The optical output interface 154 may output a signal indicating event generation using light of a light source of the display apparatus 1. Examples of events generated in the display apparatus 1 may include message reception, call signal reception, a missed call, an alarm, a schedule notice, email reception, information reception through an application, and the like.

The memory 170 may store data supporting various functions of the display apparatus 1. For example, the memory 170 may store input data, learning data, a learning model, a learning history, etc. acquired in the input interface 120.

The processor 180 may determine at least one executable operation of the display apparatus 1 based on information determined or generated using a data analysis algorithm or a machine learning algorithm. In addition, the processor 180 may control the components of the display apparatus 1 to perform the determined operation.

To this end, the processor 180 may request, search for, receive or use the data of the learning processor 130 or the memory 170, and control the components of the display apparatus 1 to perform predicted operation or operation determined to be preferable among the at least one executable operation.

At this time, the processor 180 may generate a control signal for controlling an external device and transmit the generated control signal to the external device, when connection of the external device is necessary to perform the determined operation.

The processor 180 may acquire intention information with respect to user input and determine a request of the user based on the acquired intention information.

At this time, the processor 180 may acquire intention information corresponding to user input using at least one of a speech-to-text (STT) engine for converting voice input into a character string or a natural language processing (NLP) engine for acquiring intention information of a natural language.

At this time, at least one of the STT engine or the NLP engine may be composed of an artificial neural network learned according to a machine learning algorithm. In addition, at least one of the STT engine or the NLP engine may be learned by the learning processor 130, learned by an external learned server or learned by distribution processing thereof.

The processor 180 may collect history information including content on operation of the display apparatus 1 or the feedback of the user for the operation, store the history information in the memory 170 or the learning processor 130 or transmit the history information to an external device such as an external server. The collected history information may be used to update the learning model.

The processor 180 may control at least some of the components of the display apparatus 1, in order to drive an application program stored in the memory 170. Further, the processor 180 may operate by combining two or more of the components included in the display apparatus 1, in order to drive the application program.

Figure 6:
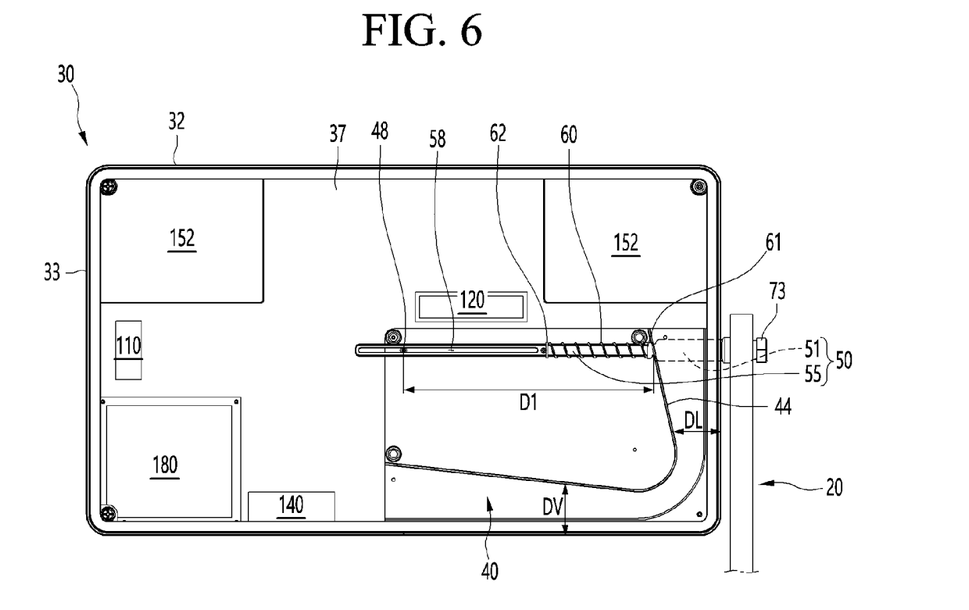
FIG. 6 is a view showing the inside of a head according to an embodiment of the present disclosure.
Figure 7:
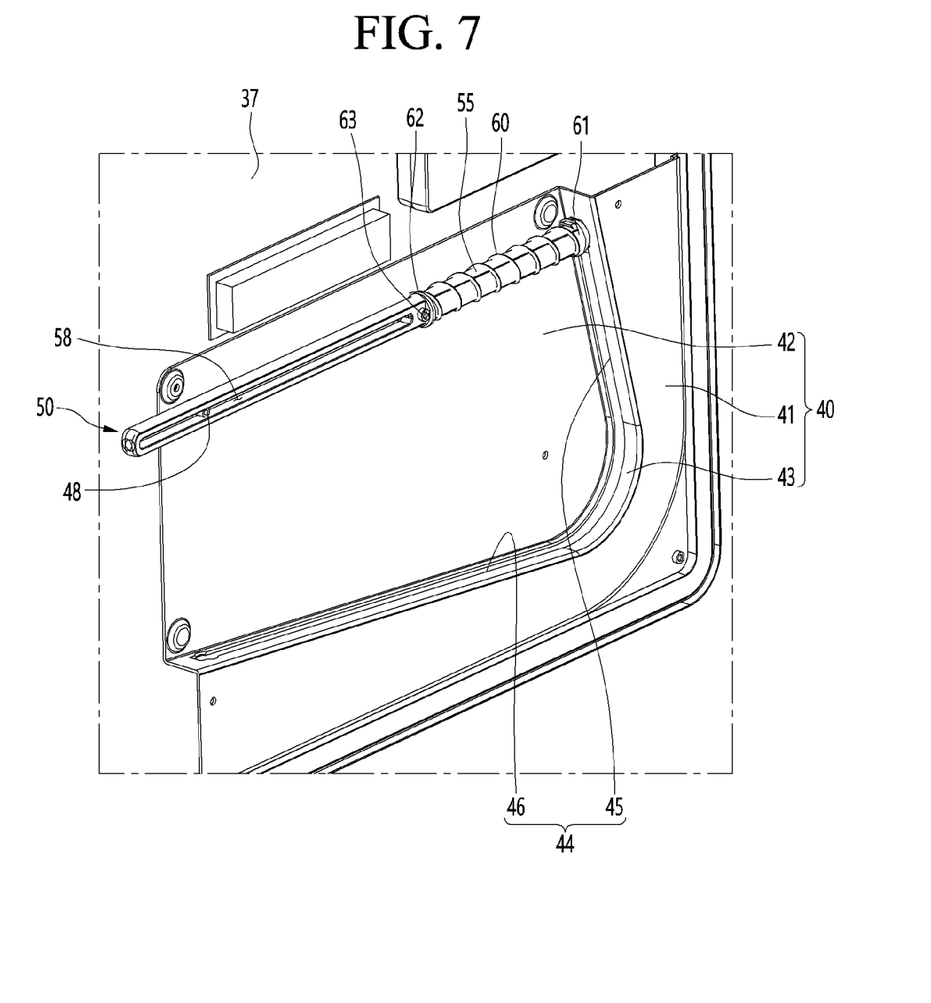
FIG. 7 is a view illustrating connection between a shaft and an inner bracket according to an embodiment of the present disclosure.
Figure 8:
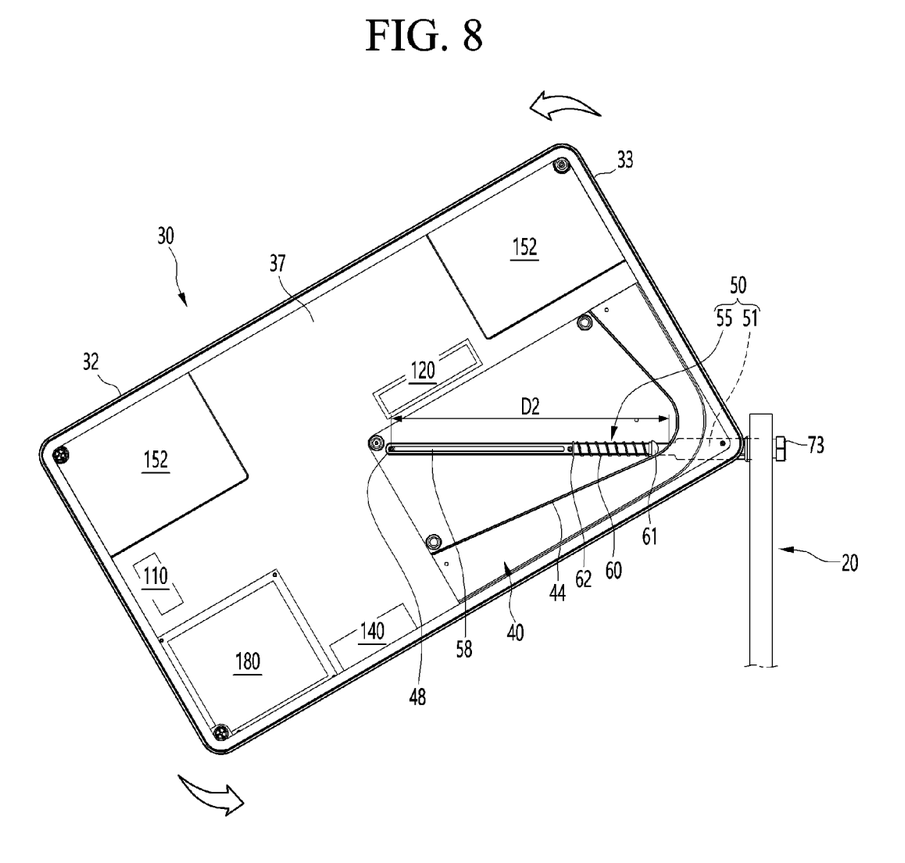
FIGS. 8 and 9 are views illustrating pivot motion of a head according to an embodiment of the present disclosure.
Figure 9:
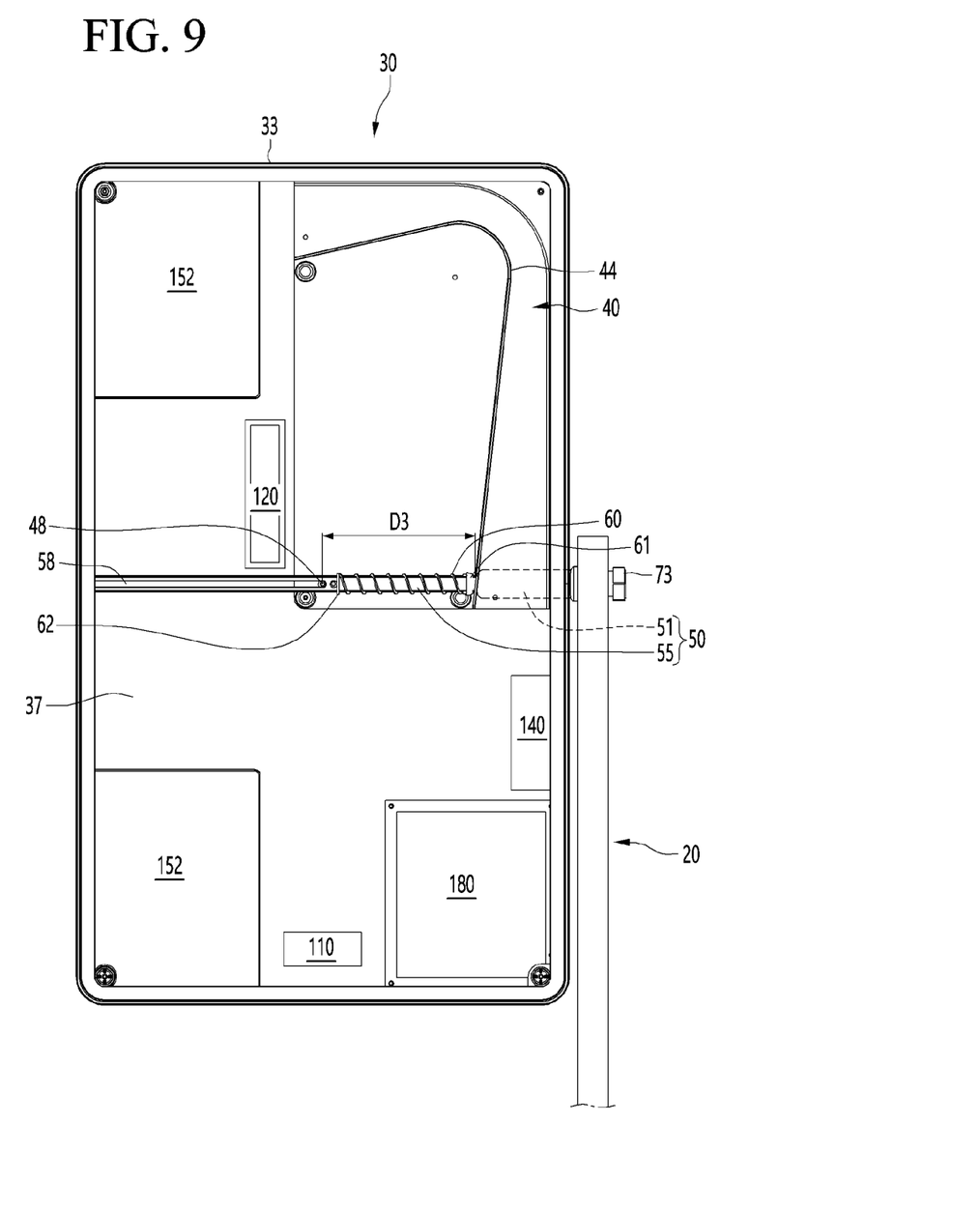

FIG. 6 is a view showing the inside of a head according to an embodiment of the present disclosure, FIG. 7 is a view illustrating connection between a shaft and an inner bracket according to an embodiment of the present disclosure, and FIGS. 8 and 9 are views illustrating pivot motion of a head according to an embodiment of the present disclosure.

An inner plate 37 may be disposed inside the head 30. A plurality of electric components may be mounted on the inner plate 37. The electric components may include at least one of a communication interface 110, an input interface 120, a sensor 140 or a processor 180. In addition, the sound output unit 152 may be mounted on the inner plate 37. The plurality of electric components and the sound output unit 152 may be disposed not to interfere with an inner bracket 40 and the shaft 50.

The display apparatus may further include the inner bracket 40 and the shaft 50.

The inner bracket 40 may be disposed inside the head 30. The inner bracket 40 may be fixed to the inside of the head 30. For example, the inner bracket 40 may be fixed to the inner plate 37.

The inner bracket 40 may be disposed at a position corresponding to the penetration groove 34 formed in the circumferences 31 and 32 of the head 30. For example, a first groove 35 (see FIG. 3) may be formed in a lower portion of the right side of the head 30 and a second groove 36 may be formed in a right portion of a lower side of the head 30, based on the direction shown in FIG. 6. In this case, the inner bracket 40 may be disposed adjacent to the lower right corner of the head 30.

The inner bracket 40 may include a first surface 41 parallel to the display, a second surface 42 stepped with respect to the first surface 41 and a guide surface 43 connecting the first surface 41 with the second surface 42.

The first surface 41 and the second surface 42 may be parallel to the display 31. The first surface 41 and the second surface 42 may be formed to be stepped with respect to each other back and forth. For example, the second surface 42 may be stepped forward with respect to the first surface 41.

The first surface 41 may be located outside the second surface 42. That is, the first surface 41 may be adjacent to the circumferences 31 and 32 of the head 30. The first surface 41 may face between the inner circumference of the head 30 and the second surface 42 in the front-and-rear direction.

The second surface 42 may be fastened to the inner plate 37. Accordingly, the inner bracket 40 may be fixed to an inner plate 37.

The guide surface 43 may connect the first surface 41 with the second surface 42. The guide surface 43 may be perpendicular to the first surface 41 and the second surface 42. The guide surface 43 may guide sliding of a slider 61 with respect to the shaft 50 at the time of pivot motion of the head 30.

The guide surface 43 may face the inner circumference of the head 30. A portion of the guide surface 43 may face a short side of the head 30 and the other portion thereof may face a long side 32 of the head 30.

More specifically, the guide surface 43 may include a first guide surface facing the short side 33 of the head 30, a second guide surface facing the long side 32 of the head 30, and a curved surface connecting the first and second guide surfaces.

A distance between the guide surface 43 and the inner circumference of the head 30 may vary in the circumferential direction of the head 30. When the head 30 is in the landscape mode, the first guide surface may be formed to be inclined in a direction close to the short side 33 of the head 30 downward. In addition, the second guide surface may be formed to be inclined in a direction close to the long side 32 of the head 30 toward the stand 20. In addition, the curved surface may connect the first guide surface and the second guide surface to be rounded.

Accordingly, the distance between the slider 30 and the inner circumference of the head 30 may easily vary, and pivot motion of the head 30 may be performed.

A slit 44, through which the shaft 50 passes, may be formed in the inner bracket 40. More specifically, the slit 44 may be formed in the guide surface 43. The slit 44 may extend along the guide surface 43.

The slit 44 may face the penetration groove 34 formed in the circumferences 31 and 32 of the head 30. Accordingly, the shaft 50 may pass through the penetration groove 34 and the slit 44.

More specifically, the slit 44 may include a first slit 45 facing a first groove 35 and a second slit 46 facing a second groove 36. The first slit 45 and the second slit 46 may be connected with each other. When the head 30 is in the landscape mode, the first slit 45 may face the first groove 35 in the horizontal direction, and the second slit 46 may face the second groove 36 in the vertical direction.

The distance between the slit 44 and the penetration groove 34 may vary in the longitudinal direction of the penetration groove 34, that is, the circumferential direction of the head 30.

More specifically, when the head 30 is in the landscape mode, the horizontal distance DL between the first slit 45 and the first groove 35 may be reduced downward. That is, the first slit 45 of the inner bracket 40 may be formed to be inclined in a direction close to the short side 33 of the head 30 downward.

In addition, when the head 30 is in the landscape mode, the vertical direction DV between the second slit 46 and the second groove 36 may be reduced toward the stand 20. That is, the second slit 46 of the inner bracket 40 may be formed to be inclined in a direction close to the long side 32 of the head 30 toward the stand 20.

Meanwhile, the shaft 50 may connect the head 30 with the stand 20. More specifically, the shaft 50 may be connected to the stand 20, and may be connected to the inner bracket 40 by extending to the inside of the head 30 through the penetration groove 34. The shaft 50 may pass through the slit 44 of the inner bracket 40.

The shaft 50 may be horizontally maintained regardless of tilt, pivot and swivel motion of the head 30.

More specifically, the shaft 50 may include a first extension 51 connected to the stand 20 and extending to the inside of the head 30 through the penetration groove 34 and a second extension 55 extending from an end of the first extension 51 to pass through the slit 44.

A portion of the first extension 51 may be located outside the head 30 and connected to the stand 20. The other portion of the first extension 51 may be located inside the head 30, and may face the first surface 41 of the inner bracket 40 in the front-and-rear direction.

The cross section of the first extension 51 may have a size and shape not to pass through the slit 44 formed in the inner bracket 40.

The second extension 55 may horizontally extend from an end of the first extension 51, and pass through the slit 44 formed in the inner bracket 40. The second extension 55 may be located inside the head 30. The second extension 55 may face the second surface 42 of the inner bracket 40 in the front-and-rear direction.

A long hole 58, through which a guide pin 48 passes, may be formed in the second extension 55. The long hole 58 may extend in the longitudinal direction of the second extension 55. The long hole 58 may penetrate in the front-and-rear direction.

The guide pin 48 may be fixed to the inside of the head 30. For example, the guide pin 48 may protrude backward from the second surface 42 of the inner bracket 40.

The guide pin 48 may slide in the long hole 58 of the shaft 50 at the time of pivot of the head 30. That is, the distance between the guide pin 48 and the slit 44 in the longitudinal direction of the shaft 50 may vary according to pivot of the head 30. Accordingly, the pivot trajectory of the head 30 may be determined by the guide pin 48 and the long hole 58. That is, the guide pin 48 and the long hole 58 may guide pivot of the head 30.

The distance between the slit 44 and the guide pin 48 in the longitudinal direction of the shaft 50 may be smaller in the portrait mode of the head 30 than in the landscape mode. More specifically, when the head 30 is in the landscape mode, the distance D1 (see FIG. 6) between the slit 44 and the guide pin 48 may be greater than the distance D3 (see FIG. 9) between the slit 44 and the guide pin 48 when the head 30 is in the portrait mode.

In addition, the distance between the slit 44 and the guide pin 48 in the longitudinal direction of the shaft 50 may be maximized when the shaft 50 passes through between the first groove 35 and the second groove 36. That is, during pivot motion of the head 30, when the shaft 50 passes through the connector between the first groove 35 and the second groove 36, the distance D2 (see FIG. 8) between the slit 44 and the guide pin 48 may be greater than the distance D1 (see FIG. 6) between the slit 44 and the guide pin 48 when the head 30 is in the landscape mode.

The guide pin 48 may move between the inner and outer ends of the long hole 58. The inner end of the long hole 58 may be adjacent to the end of the second extension 55.

As shown in FIG. 6, when the head 30 is in the landscape mode, the guide pin 48 may be located closer to the inner end than the outer end of the long hole 58.

As shown in FIG. 8, when the corners of the circumferences 31 and 32 of the head 30 face the stand 20 in the horizontal direction, the guide pin 48 may be located at the inner side of the long hole 58.

As shown in FIG. 9, when the head 30 is in the portrait mode, the guide pin 48 may be located at the outer end of the long hole 58.

Meanwhile, a slider 61 and a spring 60 may be provided on the outer circumference of the second extension 55 of the shaft 50. The slider 61 and the spring 60 may be located between the long hole 58 and the slit 44 in the longitudinal direction of the shaft 50.

The slider 61 may be an annular member surrounding the outer circumference of the second extension 55. The slider 61 may slide along the second extension 55.

The spring 60 may be connected to the slider 61. The spring 60 may pressurize the slider 61 to maintain contact between the slider 61 and the inner bracket 40. More specifically, at the time of pivot motion of the head 30, the slider 61 may maintain contact with the guide surface 43 of the inner bracket 60 by elastic force of the spring 60.

A support portion 62 supporting the spring 60 may be provided on an outer circumference of the second extension 55, and the spring 60 may be compressed between the support portion 62 and the slider 61. That is, the spring 60 may be mounted between the support portion 62 and the slider 61 in the compressed state.

The length of the spring 60 may vary at the time of pivot of the head 30. More specifically, the length of the spring 60 may be shorter in the portrait mode than in the landscape mode of the head 30. In addition, the length of the spring 60 may be maximized when the shaft 50 passes through the connector between the first groove 35 and the second groove 36.

The support portion 62 may be formed independently of the shaft 50 and may be an annular member surrounding the outer circumference of the second extension 55. In this case, a limiter 63 for limiting movement of the support portion 62 toward the long hole 58 may be provided on the second extension 55. Accordingly, the limiter 63 may be located between the support portion 62 and the long hole 58 in the longitudinal direction of the shaft 50. For example, the limiter 63 may be a fixing screw fastened to the second extension 55.

However, the present disclosure is not limited thereto and the support portion 62 may be formed integrally with the second extension 55. In this case, the limiter 63 may not be provided on the second extension 55.

Figure 10:
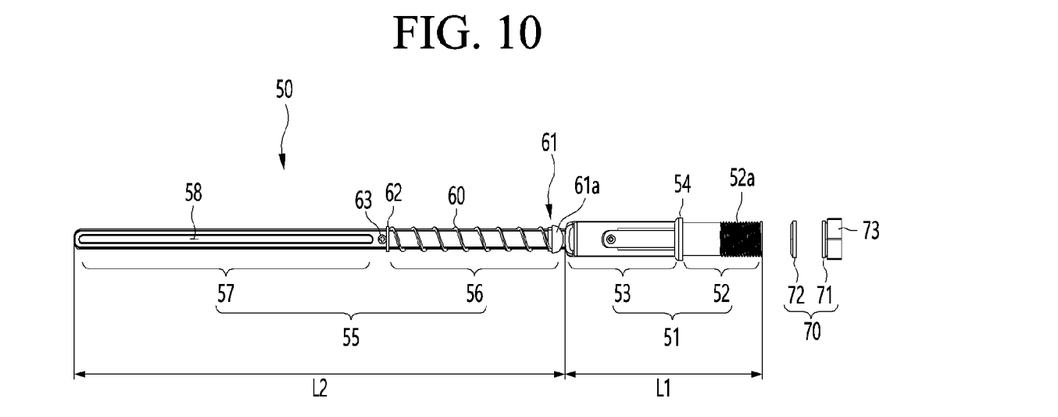
FIGS. 10 and 11 are views illustrating a shaft and components connected thereto according to an embodiment of the present disclosure.
Figure 11:
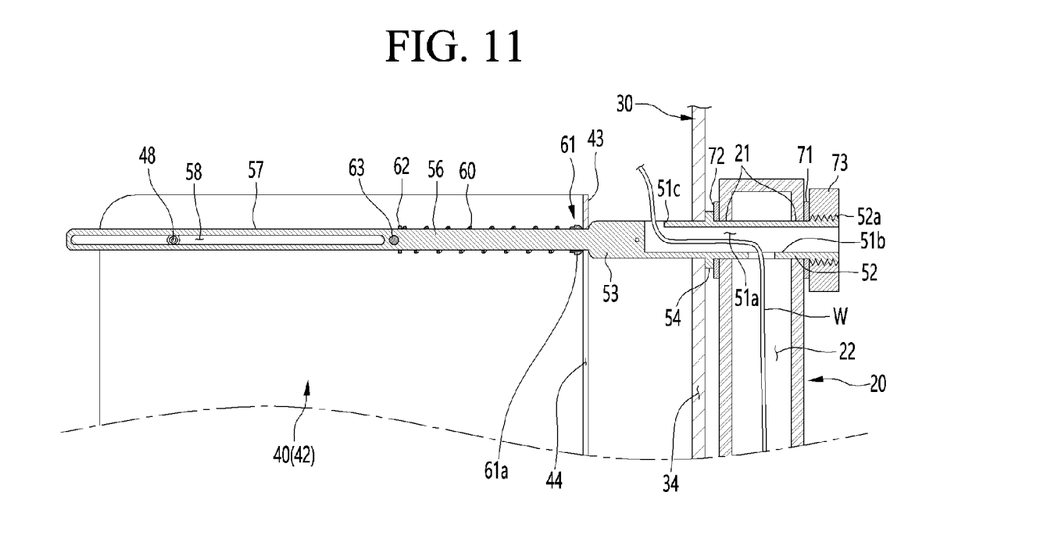

FIGS. 10 and 11 are views illustrating a shaft and components connected thereto according to an embodiment of the present disclosure.

The length L2 of the second extension 55 of the shaft 50 may be greater than the length L1 of the first extension 51.

The first extension 51 of the shaft 50 may include a stand connector 52 connected to the stand 20 and a head connector 53 extending from the stand connector 52 to pass through the penetration groove 34 of the head 30. The first extension 51 may further include an expansion 54 located between the stand connector 52 and the head connector 53.

The stand connector 52 may be rotatably connected to the stand 20. More specifically, a pair of connection holes 21 may be formed in the stand 20 and the stand connector 52 may pass through the pair of connection holes 21.

An end of the stand connector 52 may protrude to the opposite side of the head 30 with respect to the stand 20. A male thread 52a fastened to a nut 73 may be formed on the outer circumference of the end of the stand connector 52. That is, the nut 73 may be fastened to the end of the first extension 51, and the nut 73 may be located at the opposite side of the circumferences 31 and 32 of the head 30 with respect to the stand 20.

A first friction washer 71 may be provided between the nut 73 and the stand 20, and a second friction washer 72 may be provided between the stand 20 and the circumferences 31 and 32 of the head 30. The friction washers 71 and 72 may be annular members disposed on the first extension 51 and, more specifically, the outer circumference of the stand connector 52.

The level of external force required for the tilt of the head 30 may be determined by the nut 73 and the friction washers 71 and 72. Accordingly, a user may easily adjust force required for the tilt of the head 30 by tightening or loosening the nut 73. Therefore, the tilt motion of the head 30 may be softly performed.

The expansion 54 may be located between the circumferences 31 and 32 of the head 30 and the stand 20. The expansion 54 may be formed with a size not to pass through the penetration groove 34 of the head 30 and the connection hole 21 of the stand 20.

The head connector 53 may extend to the inside of the head 30 through the penetration groove 34 of the head 30. The second extension 55 may extend from an end of the head connector 53. The cross section of the head connector 53 may have a size and shape not to pass through the slit 44 of the inner bracket 40.

Meanwhile, a passage 54, through which an electric wire W passes, may be formed in the first extension 51. The electric wire W may extend from the inside of the base 10 to the inside of the head 30 through the inside of the stand 20. The electric wire W may be referred to as a wire or a cable.

For example, a battery may be disposed inside the base 10. The electric wire W may supply power stored in the battery to the plurality of electric components installed in the display 31 and the head 30.

An internal space 22, through which the electric wire W passes, may be formed in the stand 20. The internal space 22 of the stand 20 may vertically extend. That is, the stand 20 may have a pipe shape having a predetermined inner diameter.

The passage 54 formed in the first extension 51 may guide the electric wire W to the inside of the head 30. A portion of the passage 54 may be formed in the stand connector 52 and the other portion thereof may be formed in the head connector 53. Accordingly, the passage 54 may enable communication between the internal space 22 of the stand 20 and the internal space of the head 30.

More specifically, an inlet 51b enabling communication between the passage 54 and the internal space of the stand 20 may be formed in the stand connector 52. An outlet 51c enabling communication between the passage 54 and the internal space of the head 30 may be formed in the head connector 53. The electric wire W may extend to the inside of the head 30, by sequentially passing through the inlet 51b, the passage 54 and the outlet 51c.

Meanwhile, the second extension 55 of the shaft 50 may include a slit passage portion 56 passing through the slit 44 of the inner bracket 40 and a long hole portion 57 in which the long hole 58 is formed.

The slit passage portion 56 may extend from the head connector 53 of the first extension 51. In addition, the long hole portion 57 may extend from the slit passage portion 56. The long hole portion 57 may include an end of the second extension 55.

The support portion 62 supporting the spring 60 and the limiter 63 for limiting movement of the support portion 62 toward the long hole portion 57 may be provided on the end of the slit passage portion 56.

The slider 61 may slide along the slit passage portion 56 and may be held in contact with the inner bracket 60 by the spring 60. The spring 60 may be wound around the outer circumference of the slit passage portion 56.

The slider 61 may include a curved surface 61a contacting the inner bracket 40. More specifically, the curved surface 61a of the slider 61 may be in contact with the guide surface 43 of the inner bracket 40. Preferably, the curved surface 61a of the slider 61 may be in point-contact or line-contact with the guide surface 43. For example, the curved surface 61a may form a part of a spherical surface.

Accordingly, a contact area between the slider 61 and the inner bracket 40 may be reduced.

According to the preferable embodiment of the present disclosure, since the guide pin located inside the head slides along the long hole of the shaft, the heat may be pivoted between the landscape mode and the portrait mode. Therefore, the pivot trajectory of the head may be determined by only a simple structure. In addition, a user can intuitively pivot the head without horizontally or vertically moving the head.

In addition, the slider connected to the shaft may be held in contact with the inner bracket by the spring. Accordingly, the position of the guide pin relative to the long hole of the shaft may be determined by the guide surface contacting the slider. Therefore, pivot motion of the head may be reliably performed.

In addition, since the shaft sequentially passes through the penetration groove of the head and the slit of the inner bracket, the length of the shaft required to implement the pivot motion of the head may be relatively reduced. Therefore, the size of the header may be reduced.

In addition, the electric wire may extend from the inside of the base to the inside of the head by sequentially passing through the inside of the stand and the passage formed in the shaft. Therefore, since the electric wire is not exposed to the outside, the appearance of the display apparatus may be neat.

In addition, the slider may include a curved surface which is in point-contact or line-contact with the inner bracket. Therefore, the contact area between the slider and the inner bracket may be minimized.

In addition, external force required to rotate (tilt) the head may be easily adjusted by the nut and the friction washer. Therefore, the head may be reliably tilted with respect to the horizontal axis.

In addition, since the rear surface of the head may rotate (tilt) forward, the display apparatus may be used for another purpose such as a standing mirror or light according to components (e.g., a backlight and a mirror) provided on the rear surface of the head.

The above description is merely illustrative of the technical spirit of the present disclosure, and those of ordinary skill in the art to which the present disclosure pertains will appreciate that various modifications and variations are possible without departing from the essential characteristics of the present disclosure.

Therefore, the embodiments disclosed in the present disclosure are not intended to limit the technical spirit of the present disclosure, but are intended to describe the embodiments of the present disclosure, and the scope of the technical spirit of the present disclosure is not limited by these embodiments.

The scope of the present disclosure should be interpreted by the following claims, and all technical spirits within the equivalent range of the appended claims should be interpreted as being included in the scope of the present disclosure.

What is claimed is:

1. A display apparatus comprising:
    a base;
    a stand vertically extending upward from the base;
    a head having a display provided on a front surface thereof and pivotable between a landscape mode in which a long side of a circumference is in a horizontal state and a portrait mode in which the long side is in a vertical state;
    a penetration groove extending along the circumference of the head;
    an inner bracket disposed inside the head and having a slit formed therein to face the penetration groove;
    a shaft including a first extension connected to the stand and extending to an inside of the head through the penetration groove and a second extension extending from an end of the first extension to pass through the slit;
    a long hole formed in the second extension and extending in a longitudinal direction of the second extension;
    a guide pin fixed to an inside of the head to pass through the long hole;
    a slider sliding along the second extension; and
    a spring disposed on an outer circumference of the second extension and configured to pressurize the slider to maintain contact between the slider and the inner bracket.

2. The display apparatus of claim 1, wherein a distance between the slit and the penetration groove varies in a longitudinal direction of the penetration groove.

3. The display apparatus of claim 1, wherein a distance between the slit and the guide pin in a longitudinal direction of the shaft is smaller in the portrait mode than in the landscape mode of the head.

4. The display apparatus of claim 1, wherein the penetration groove comprises:
    a first groove extending along a short side of the circumference of the head; and
    a second groove extending along the long side of the circumference of the head and connected with the first groove.

5. The display apparatus of claim 4, wherein the slit comprises:
    a first slit facing the first groove; and
    a second slit connected to the first slit and facing the second groove.

6. The display apparatus of claim 4, wherein a distance between the slit and the guide pin in a longitudinal direction of the shaft is maximized when the shaft passes through between the first groove and the second groove.

7. The display apparatus of claim 1, wherein the guide pin protrudes from the inner bracket.

8. The display apparatus of claim 1, wherein the shaft is horizontally maintained at the time of pivot of the head.

9. The display apparatus of claim 1, wherein a length of the second extension is greater than that of the first extension.

10. The display apparatus of claim 1,
wherein a support portion supporting one end of the spring is provided on an outer circumference of the second extension, and
wherein the spring is compressed between the support portion and the slider.

11. The display apparatus of claim 10, wherein the support portion is located between the long hole and the spring in a longitudinal direction of the second extension.

12. The display apparatus of claim 1, further comprising an electric wire extending from an inside of the base to an inside of the head through an inside of the stand,
wherein a passage for guiding the electric wire to the inside of the head is formed in the first extension.

13. The display apparatus of claim 1,
wherein the inner bracket comprises:
a first surface parallel to the display;
a second surface stepped with respect to the first surface; and
a guide surface connecting the first surface and the second surface, having the slit formed therein, and contacting the slider.

14. The display apparatus of claim 1, wherein the slider comprises a curved surface which is in point-contact or line-contact with the inner bracket.

15. The display apparatus of claim 1, wherein an expansion expanding outward in a radial direction and located between the stand and the circumference of the head is formed at the first extension.

16. The display apparatus of claim 1,
wherein a pair of connection holes is formed in the stand, and
wherein the first extension is rotatably connected to the stand by passing through the pair of connection holes.

17. The display apparatus of claim 16, further comprising a nut fastened to an end of the first extension,
wherein the nut is located at an opposite side of the circumference of the head with respect to the stand.

18. The display apparatus of claim 17, further comprising a friction washer provided on an outer circumference of the first extension and located between the nut and the stand.

* * * * *